United States Patent [19]

Biglow

[11] Patent Number: 4,939,520

[45] Date of Patent: Jul. 3, 1990

[54] ANALOG TO DIGITAL CONVERTER USING AN INTEGRATOR HAVING A PARTIALLY CONTROLLED OUTPUT SIGNAL

[75] Inventor: James W. Biglow, Worcester, Mass.

[73] Assignee: Analogic Corporation, Peabody, Mass.

[21] Appl. No.: 262,624

[22] Filed: Oct. 26, 1988

[51] Int. Cl.⁵ .............................................. H03M 1/52
[52] U.S. Cl. .................................... 341/167; 341/128
[58] Field of Search ................. 341/128, 155, 167, 172

[56] References Cited

U.S. PATENT DOCUMENTS

| | | | |
|---|---|---|---|
| 3,267,458 | 8/1966 | Anderson et al. | 341/128 |
| 3,281,827 | 10/1966 | Olshausen et al. | 341/143 |
| 4,620,178 | 10/1986 | Naito | 341/167 |
| 4,694,277 | 9/1987 | Takahashi | 341/167 |

FOREIGN PATENT DOCUMENTS 0212824 12/1982 Japan.

Primary Examiner—William M. Shoop, Jr.
Assistant Examiner—Mare S. Hoff

[57] ABSTRACT

The present invention provides an analog to digital converter, including an integrator for producing an output signal and having an input, a connection for an input signal to the integrator input, and a controller for periodically applying a reference signal to the integrator input for causing the integrator output signal to have a predetermined average value, for measuring the amount of time that the reference is applied to the integrator input, and for calculating a digital representation of the analog signal.

17 Claims, 1 Drawing Sheet

ANALOG TO DIGITAL CONVERTER USING AN INTEGRATOR HAVING A PARTIALLY CONTROLLED OUTPUT SIGNAL

BACKGROUND OF THE INVENTION

1. Field of the Invention

The present invention generally relates to analog to digital (A/D) converters and, in particular, to such converters which use a charge balance conversion technique.

2. Statement of the Prior Art

Charge balance analog to digital converters were initially developed in the early 1960's as a modification of the dual slope technique and as evidenced by U.S. Pat. Nos. 3,267,458 and 3,281,827. Generally, an unknown input signal and a reference signal are both coupled to the input of a single integrator which has its output signal compared to ground. While the input signal is constantly applied to the integrator input, the reference signal is alternately coupled to and uncoupled from the integrator input, which coupling changes the direction of change of the integrator output signal. The uncoupling is determined by the comparator indicating that the integrator output has crossed zero volts. The reference signal is then recoupled a fixed time period after the uncoupling. This process reoccurs a multiplicity of times over a predetermined period and the number of times or amount of time that the reference signal is coupled is measured, usually by a digital counter or clock. The time of coupling is then proportional to the unknown input signal.

The current state of the art may be evidenced by an A/D converter chip set sold by Siliconix and designated LD110/LD111A. Control logic coupled to the comparator outPut determines the duty cycle of the reference signal coupling. One of two duty cycles is selected depending upon whether the comparator output is either positive or negative, to cause the integrator output to tend towards zero volts.

As with many analog to digital converters, there are a number of cost and performance trade offs which may be made within the construction of a converter to optimize its performance for any given application. SPecific performance parameters include conversion speed, resolution and accuracy. An example of a performance trade off would be speed versus resolution. A cost trade off would include the cost of precision components to produce a certain level of accuracy at a given speed and resolution.

With these variable parameters in mind, the measure of advances in the art of converslon is concerned with not just the specific parameters but also with improving all of the performance parameters at once so that component costs may be simultaneously reduced without sacrificing performance.

SUMMARY OF THE INVENTION

Accordingly, the present invention provides an analog to digital converter which improves upon the charge balance conversion technique while expanding the flexibility of all of the performance parameters and also reducing instrument cost.

In one embodiment, the present invention comprises an integrator means for producing an output signal and having an input, means for connecting an input signal to the integrator means input, and control means for periodically applying a reference signal to the integrator means input for causing the integrator means output signal to have a predetermined average value, for measuring the amount of time that the reference is applied to the integrator means input, and for calculating a digital representation of the analog signal.

In another embodiment, the analog to digital converter comprises an integrator means for producing an output signal and having an input, means for connecting an input signal to the integrator means input, and control means for periodically applying a reference signal to the integrator means input for controlling the amount of time that the integrator means output signal spends above or below a predetermined value, for measuring the amount of time that the reference is applied to the integrator means input, and for calculating a digital representation of the analog signal.

In yet another embodiment, the analog to digital converter comprises:

an integrator means having an integrating input and an output;

first means for switchably coupling an input signal to the integrator means input;

second means for switchably coupling a first reference signal to the integrator means input;

third means for switchably coupling a second reference signal to the integrator means input;

comparator means for sensing the relative polarity between the integrator means output and a predetermined reference value;

computer control means for controlling the first, second and third means for coupling, having means for receiving the relative polarity sensed by the comparator means and including;

first instruction means for coupling the input signal to the integrator means input;

second instruction means for alternately coupling and uncoupling the first reference signal to the integrator means input for a controllable amount of time during each of a predetermined number of fixed intervals and including third instruction means for controlling the amount of time that the first reference signal is coupled to the integrator means input during each interval for causing the integrator means output to have a predetermined average value;

fourth instruction means for measuring the amount of time that the first reference signal is coupled to the integrator means input;

fifth instruction means for uncoupling the input signal from the integrator means inPut and for coupling the second reference signal to the integrator means input at the end of the predetermined number of fixed intervals for reducing the integrator means output to the predetermined average value and including sixth instruction means for measuring the amount oi time that the second reference is so coupled; and seventh instruction means for calculating a digital representation of the input signal in response to the amount of time that the first and second reference signals are coupled to the integrator means input.

BRIEF DESCRIPTION OF THE DRAWINGS

The present invention is illustratively described below in reference to the accompanying drawings of which.

DETAILED DESCRIPTION OF THE DRAWINGS

Figure 1:
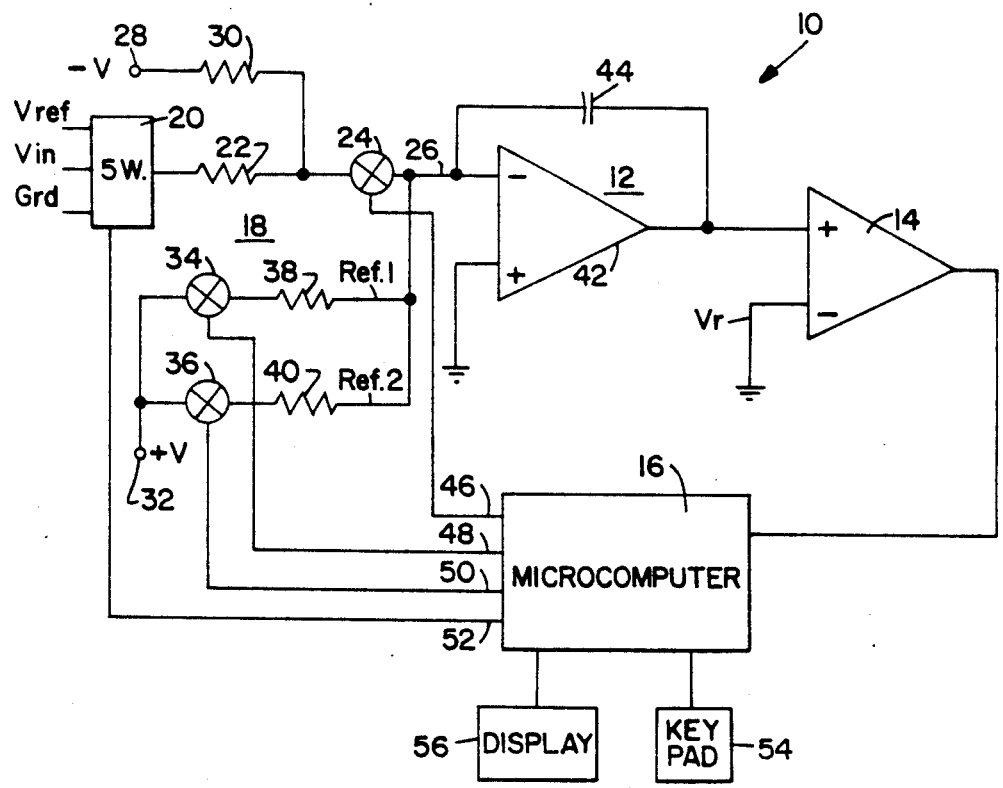
FIG. 1 is a simplified schematic diagram of one embodiment of the present invention.

An analog to digital converter 10 is shown in FIG. 1 constructed in accordance with one embodiment of the present invention and generally includes an integrator 12, a comparator 14, a microcomputer 16, and input circuitry 18 for the integrator 12.

More specifically, circuitry 18 includes an input selection switch 20 for receiving reference voltages, Vref and Grd, and an unknown analog signal, Vin, for analog to digital (A/D) conversion. A resistor 22 and a switch 24 couple the output of switch 20 to a summing junction 26. A negative bias voltage, $-V$, is coupled through a terminal 28, a resistor 30 and the same switch 24 to the summing junction 26. The bias voltage $-V$ is sufficiently negative to insure that the conventional current flow through switch 24 will always be from the summing junction 26 regardless of the input signal.

A reference voltage $+V$ is coupled through a terminal 32, a pair of switches 34, 36 and resistors 38, 40, respectively, to the summing junction 26. Switch 34 and resistor 38 produce a first reference signal Ref.1, and switch 36 and resistor 40 produce a second reference signal Ref. 2. The polarity of $+V$ insures that the conventional current flow therefrom will always be into the summing junction 26 when either switch 34 or 36 is closed. Ref. 1 is of sufficient magnitude to sustain this current direction even with switch 24 closed and $-V$ thus coupled to junction 26.

Summing junction 26 is coupled to the integrating or negative input of integrator circuit 12 which includes an operational amplifier 42 and a capacitor 44. The output of amplifier 42 is coupled to the positive input of the comparator 14, which has its negative input coupled to a voltage reference, Vr, in this case ground. The output of comparator 14 is coupled to an input of the microcomputer 16 to thereby si8nal the microcomputer 16 whether the output signal of the integrator 12 is either positive or negative with respect to ground. Although ground is used for the purpose of this embodiment, any suitable voltage reference may be used for Vr. The purpose of this voltage reference Vr is described in greater detail below.

Microcomputer 16 includes four outputs 46, 48, 50 and 52, respectively, coupled to control one of each of the switches 24, 34, 36 and 20. The microcomputer 16 is a four bit model 75208 from NEC and includes a memory within which are stored operating instructions for causing the microcomputer 16 to control the analog to digital converter 10. Further couPled to microcomputer 16 are a keypad 54 and a display 56 for providing operator interface. Other interfaces may be provided as desired such as the industrial standard RS232 interface.

The general conversion process performed by the embodiment of FIG. 1 is described in reference to FIG. 2 which shows a typical waveform for the output signal of integrator 12 and also in reference to Table 1 below which lists the general program steps performed by microcomputer 16. The timing referred to below is performed by the microcomputer 16 by means of a running counter, the count of which is recorded at specific instances and used along with other recorded counts for calculating time periods. Microcomputer 16 includes a clock which sequences the counter.

TABLE 1

| |
|---|
| 100 Connect input 101 Connect Ref. 1 |
| 102 Count down 50 us |
| 104 Disconnect Ref. 1 |
| 106 Record zero crossing time |
| 108 Determine next pulse width |
| 110 Connect Ref. 1 |
| 112 Count down pulse width |
| 114 Record zero crossing time |
| 116 Disconnect Ref. 1 |
| 116a Accumulate pulse with |
| 118 Record zero crossing time |
| 120 Calculate low time |
| 122 Determine next pulse width |
| 124 Count down 127 cycles |
| 126 Repeat 110 or quit |
| 130 Disconnect input and connect Ref. 2 |
| 132 Record zero crossing time and calculate decay time |
| 134 Disconnect Ref. 2 |

Each specific conversion process generally includes a coarse conversion phase and a fine conversion phase. During the coarse conversion phase, the coarse reference signal Ref.1 is repeatedly connected to and disconnected from the integrator input a predetermined number of times while the unknown input signal remains connected. The number of connection times is set by a predetermined number of fixed length intervals or cycles. The length of each Period of connection of Ref.1 during each interval or cycle may be defined as a percentage or duty cycle of each fixed interval. The length of each connectIon is controlled so as to maintain the integrator output either above or below the reference voltage Vr for a specific percentage or duty cycle of each predetermined interval. When this duty cycle is maintained at 50% the average value of the integrator output is equal to the voltage reference, Vr.

More specifically, each conversion process is performed over a time period of 33.3 milliseconds which includes 128 coarse cycles of 280.4 $\mu s$ (microseconds) each and an additional fine cycle of 16 milliseconds. The process is begun with cycle 1 in FIG. 2 and program steps 100 and 101 by the simultaneous connection of one of the input signals via switch 20 and switch 24 to summing junction 26 along with the coarse reference, Ref.1. Step 100 constitutes a first instruction means for coupling the input signal to the integrator input. This connection is allowed to continue by step 102 for a period of 50 $\mu s$, during which the output of integrator 12 moves in a negative direction, as shown by section 103 of FIG. 3. Ref. 1 is designed to cause this direction of movement regardless of the level of the input signal.

Ref.1 is disconnected by step 104 via switch 34 which causes the output of integrator 12 to move in a positive direction as shown by section 105. Program step 106 records the zero crossing time 107 of the integrator output signal. From this zero crossing time, step 108 calculates the amount of time that the output oi integrator 12 wa below zero and irom that determines the pulse width during which Ref.1 will be connected for the following cycle. For the purpose of this first cycle of the conversion process, the pulse width for the following cycle is best determined by means of a look-up table.

For many positive levels of input signals the integrator output will not cross zero volts during the first cycle. Whenever, the zero crossing is not detected for measurement, the Ref.1 pulse width for the following cycle is set at a low value so that the integrator output will not go negative by a large amount but will substantially continue to rise. This approach will continue co be used for each succeeding cycle until a crossing is detected.

Cycle 1 is concluded after 280.4 us at point 109 by the program step 110 which reconnects the coarse reference, Ref.1, to summing junction 26. With this connection, program step 112 begins to count down the pulse width for section 111 as determined in program step 108. During this countdown the zero crossing at point 113 is recorded by program step 114. When the period 111 is counted down, Ref.1 is disconnected from summing junction 26 by program step 116. Step 116 a accumulates the total pulse width time during which Ref.1 is connected, including the initial 50 μs, so that the total connection time is known. The disconnection of Ref.1 causes the output of integrator 12 to begin to move in a positive direction as shown in section 115, during which time the zero crossing at point 117 is recorded by program step 118.

With the zero crossing points 113 and 117 so recorded, the program step 120 may then calculate the time period 119 during which the output of integrator 12 was below the voltage reference, Vr, of zero volts. From this calculated low time the program step 122 may then determine the pulse width for the next sequential cycle. This is done, beginning in the cycle following the first cycle in which a zero crossing is detected, by first determining the error, or difference between the desired or set point low time for the integrator output, with the measured low time. For example, the actual low time may be measured to an accuracy of one part in twenty, with each cycle representing a full count of twenty. A desired or set point low time of 50% is represented by the number 10. A measured low time of 12 would result in an error of −2.

The calculated error is then used in combination with the pulse width, PW(n), just used in the present cycle to calculate the pulse width, PW(n+1), for the following cycle. The error may first be multiplied by a correction factor, k, after which it is added to PW(n). The result is PW(n+1). This calculation may thus be represented as follows:

PW(n+1)=PW(n)+(Error ⓒk), where

Error=desired low time − measured low time.

In the present embodiment the correction factor k is one (1).

In order to guarantee a positive residual at the end of each conversion process, it is helpful to keep the error as close to zero as possible. To accomplish this the pulse width settings in the look-up table are set higher than the optimum values for each case. Further, the base value PW(n) for each calculation is decremented whenever the Error is negative. This causes a reduction of the low time of the integrator output until the Error becomes positive.

Figure 2:
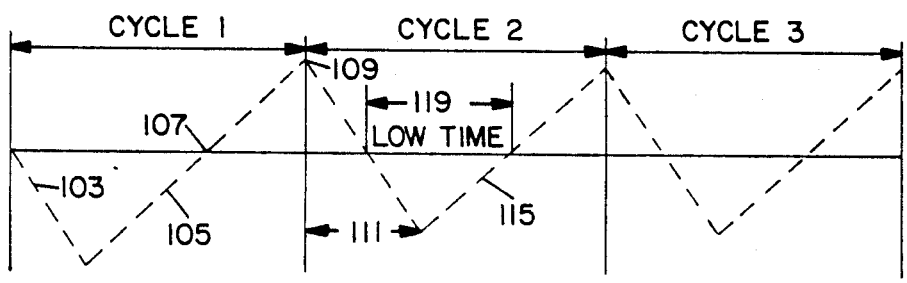
FIG. 2 is a typical waveform diagram for the analog to digital conversion process performed by the embodiment of FIG. 1.

The combination of the two linear slopes per cycle as shown in FIG. 2 and a successful averaging oi either the low time or high time around approximately 50% of the pulse width causes the integrator output signal to have an average value, regardless of the input signal, equal to approximately the voltage reference Vr of zero volts. Of course, this average value may be any predetermined value as controlled by Vr.

At the conclusion of cycle 2, program step 124 decrements a cycle counter by one and returns the program to step 110. Thusly, the program steps 110 through 126 are repeated for the remaining 126 cycles. Steps 101 and 116 and 118 through 126 constitute second instruction means for alternately coupling and uncoupling the first reference signal to the integrator input for a controllable amount of time during each of a predetermined number of fixed intervals. These include steps 118 through 122 which constitute third instruction means for controlling the amount of time that the first reference signal is coupled to the integrator input during each interval for causing the integrator output to have a predetermined average value. Third instruction means includes step 120 which constitutes eighth instruction means for measuring the amount of time that the integrator output spends above or below the predetermined average value. Step 116a constitutes fourth instruction means for accumulating the total amount of time that the first reference signal is coupled to the integrator input. At the conclusion of these cycles, program step 130 causes disconnection of the input signal and Ref.1 from summing junction via the switch 24. Step 130 also connects the fine reference, Ref. 2 to the summing junction 26 via switch 36. This connection causes the slow linear decay of the output of integrator towards zero volts. When comparator 14 indicates the crossing of zero volts, the crossing time is recorded by step 132 which then calculates the amount of time used by the Ref. 2 to dissipate the outPut of integrator 12 to zero. This calculated fine time for Ref. 2 may then be used in conjunction with the accumulated Ref.1 pulse width time from step 116 in determining a digital value for the input signal. Steps 130 and 132 constitute fifth instruction means for uncoupling the input signal from the integrator input and for coupling the second reference signal to the integrator input at the end of the predetermined number of fixed intervals for reducing the integrator output to the predetermined average value. Included is step 132 which constitutes sixth instruction means for measuring the amount of time that the second reference is so coupled.

A final step 134 disconnects Ref.2.

Table 2 shows additional program steps performed by the program resident in microcomputer 16. For each analog to digital conversion the microcomputer 16 measures a ground reference, a voltage reference, and then the unknown input. Table 2 shows how these values are used to produce the output result.

TABLE 2

| | |
|---|---|
| 150 | Ground Reference Count Calculation |
| | mult. course counts by factor |
| | mult. fine counts by factor |
| | add course and fine products |
| | divide out fine mult. factor |
| 152 | Add zero offset calibration amount |
| 154 | Average ground reference samples |
| 156 | Voltage Reference Count Calculation |
| 158 | Average voltage reference samples |
| 160 | Subtract ground reference average |
| 162 | Divide by a calibration constant |
| 164 | Determine a temperature compensation mult. |
| 166 | Unknown Input Count Calculation |
| 168 | Average unknown input samples |
| 170 | Subtract ground reference average |
| 172 | Mult. by temperature comp. multiplier producing calibrated binary value |
| 174 | Calculate Mx + B for display scale |
| 176 | Transmit/Display value |
| 178 | Compare value against set points and output |
| 180 | Calculate Nx + C on binary value for analog output |

Program step 150 shows the calculation process used for producing a binary value from the Ref.1 and Ref.2 counts resulting from the program steps 116 and 132 of Table 1. These steps include multiplying the Ref.1 counts by a coarse multiplication factor, multiplying the Ref.2 counts by a fine multiplication factor, adding the Ref.1 and Ref.2 products produced from these prior multiplications, and then dividing out the fine multiplication factor. The inclusion of the fine multiplication factor compensates for lack of a floating point multiplier and can be eliminated with such a multiplier.

To the ground reference count calculation, step 152 adds a zero offset calibration amount derived during initial calibration of the instrument. A number of these calibrated values for the ground reference are then averaged in program step 154. The microcomputer 16 then causes sampling of a voltage reference in step 156 and performs count calculation in the same manner as described for step 150. A number of these samples are then averaged in step 158. Following this, step 160 subtracts the ground reference average produced in step 154 from the voltage reference average of step 158. In step 162 the voltage reference reading is then multiplied by a calibration constant determined during calibration of the instrument. Step 164 then compares the voltage reference value against a stored value to determine variation based upon temperature drift of the instrument and determines a temperature compensation multiplication value.

The microcomputer then samples the unknown input in step 166 and causes a calculation of the counts thereof in the same manner as performed in step 150. These counts are then averaged for several samples in program step 168. From the unknown input average is subtracted the ground reference average produced in step 154. In step 172 the offset adjusted sample average is then multiplied by the temperature compensation multiplier produced in step 164 resulting in the production of the calibrated binary value for the unknown input signal. Steps 166 through 172 constitute seventh instruction means for calculating a digital representation of the input signal in response to the amount of time that the first and second reference signals are coupled to the integrator input.

This binary value may then be used in various ways. Step 174 converts the binary number into a display scale value by multiplying by a multiplier M and adding an offset B. This binary coded decimal or whatever value may then be transmitted and/or displayed in step 176. Further, this converted value may be compared against operator inputted set points and the results of such comparison outputted for various purposes. Lastly, the calibrated binary value for the sample produced in step 172 may be used by step 180 to produce an analog output which may include conversion to the proper scale by multiplication times a factor N and addition of an offset C.

CONCLUSION

The analog to digital converter described above thus includes a improvement of the previously known charge balance technique which controls the application of the reference signal to cause the output si8nal of the integrator to either have a predetermined average value or to spend a predetermined amount of time either above or below a predetermined value. The time so spent is measured and controlled accordingly. When this time is substantially evenly divided above and below the predetermined value, the output signal has an average value substantially equal to the predetermined value. This predetermined value may be set for any desired value. The use of zero volts for the average output signal causes the integrator to operate in the most linear response area of its oPerating range. This aids the accuracy of the converter.

Converters constructed in accordance with the present invention substantially expand performance-cost parameters over the existing art. The resolution provided is very high which causes the accuracy to be a function of the cost of the major components. Thus several accuracy grades of instrument may be constructed simply using different quality components plugged into the same board layout The inherent resolution also reduces the internal operating frequency requirements of the instrument which can reduce power consumption to a level which allows the use of an unventilated case.

The technique oi the present invention allows the use oi a higher slew rate for the integrator which reduces the cost of the integrating capacitor. The use of a microprocessor greatly reduces the number and cost of additional digital components and allows for a variety of options such as analog output, setpoints, 25 and RS 232 serial communications with a minimum of external hardware.

The embodiments of the present invention described above are intended to be taken in an illustrative and not a limiting sense. Various modifications and changes may be made to these embodiments by persons skilled in the art without departing from the scope of the present invention as defined in the appended claims.

What is claimed is:

1. An analog to digital converter, comprising:
   an integrator means for producing an output signal and having an input;
   means for connecting an input signal to the integrator means input;
   control means including means for periodically applying a first reference signal to the integrator means input for causing the integrator means output signal to have a predetermined average value, means for measuring the amount of time that the reference signal is applied to the integrator means input, and means for calculating a digital representation of the analog signal based upon the measured amount of time.

2. The converter of claim 1, wherein the means for periodically applying includes means for coupling the reference signal to the integrator means input for a controllable amount of time during each of a predetermined number of fixed intervals and means for determining the amount of time for each coupling for causing the integrator means output signal to have the predetermined average value.

3. The converter of claim 2, wherein the means for determining includes comparator means coupled to receive the integrator means output signal and means responsive to the comparator means for measuring the amount of time that the output signal is above or below the predetermined average value.

4. The converter of claim 3 wherein the for periodically means applying causes the integrator means output signal to be above or below the predetermined average value for approximately fifty percent of the total time of the fixed intervals.

5. The converter of claim 3, wherein the comparator means includes means for providing a reference voltage representing the predetermined average valve.

6. The converter of claim 5, wherein the predetermined average value is zero volts.

7. The converter of claim 2, wherein the control means includes means for causing the uncoupling of the input signal from the integrator means input after the predetermined number of fixed intervals, second means for coupling a second reference signal to the integrator means input for reducing the integrator means output signal to the predetermined average value, and second means for measuring the amount of time that the second reference signal is applied.

8. The converter of claim 7, wherein the means for calculating is responsive to the amounts of time that the said first and second reference signals are coupled to the integrator means input.

9. The converter of claim 1, further comprising biasing means coupled to the means for connecting an input signal for causing the integrator means output signal to change in opposite polarity directions when the reference signal is applied and not applied to the integrator means input.

10. An analog to digital converter, comprising:
an integrator means having an integrating input and an output;
first means for switchably coupling an input signal to the integrator means input;
second means for switchably coupling a first reference signal to the integrator means input;
third means for switchably coupling a second reference signal to the integrator means input;
comparator means for sensing the relative polarity between the integrator means output and a predetermined reference value;
computer control means for controlling the first, second and third means for coupling, having means for receiving the relative polarity sensed by the comparator means and including;
first instruction means for coupling the input signal to the integrator means input;
instruction means for alternately coupling and uncoupling the first reference signal to the integrator means input for a controllable amount of time during each of a predetermined number of fixed intervals and including third instruction means for controlling the amount of time that the first reference signal is coupled to the integrator means input during each interval for causing the integrator means output to have a predetermined average value;
fourth instruction means for accumulating the total amount of time that the first reference signal is coupled to the integrator means input;
fifth instruction means for uncoupling the input signal from the integrator means input and for coupling the second reference signal to the integrator means input at the end of the predetermined number of fixed intervals for reducing the integrator means output to the predetermined average value and including sixth instruction means for measuring the amount of time that the second reference is so coupled; and
seventh instruction means for calculating a digital representation of the input signal in response to the amount of time that the first and second reference signals are coupled to the integrator means input.

11. The converter of claim 10, wherein the third instruction means includes eighth instruction means for measuring the amount of time that the integrator means output spends above or below the predetermined average value.

12. The converter of claim 11, wherein the third instruction means controls the coupling of the first reference signal to the integrator means input to cause the integrator means output to be above the predetermined average value for just more than half of the total time of the fixed intervals.

13. The converter of claim 11, wherein the predetermined average value equals the predetermined reference value.

14. An analog to digital converter, comprising:
an integrator means for producing an output signal and having an input;
means for connecting an input signal to the integrator means input;
control means including means for periodically applying a reference signal to the integrator means input for controlling the amount of time that the integrator means output signal spends above or below a predetermined value, means for accumulating the total amount of time that the reference is applied to the integrator means input, and means for calculating a digital representation of the analog signal based upon the accumulated total amount of time.

15. The converter of claim 14, wherein the means for periodically applying includes means for coupling the reference signal to the integrator means input for a controllable amount of time during each of a predetermined number of fixed intervals and means for determining the amount of time for each coupling.

16. The converter of claim 15, wherein the for periodically applying means includes means for causing the uncoupling of the input signal from the integrator means input after the predetermined number of fixed intervals, second means for coupling a second reference signal to the integrator means input for reducing the integrator means output signal to the predetermined average value, and second means for measuring the amount of time that the second reference signal is applied.

17. The converter of claim 16, wherein the means for calculating is responsive to the amount of time that the first said and second reference signals are coupled to the integrator means input.

* * * * *

UNITED STATES PATENT AND TRADEMARK OFFICE
CERTIFICATE OF CORRECTION

PATENT NO. : 4,939,520

DATED : July 3, 1990

INVENTOR(S) : Biglow, James W.

It is certified that error appears in the above-identified patent and that said Letters Patent is hereby corrected as shown below:

Claim 4, column 8, line 61, after "3" insert -- , --;

Claim 4, column 8, line 61, after "the" (second occurrence) insert -- means --;

Claim 4, column 8, line 62, delete "means" (first occurrence);

Claim 5, column 8, line 68, delete "valve" and substitute therefor -- value --;

Claim 7, column 9, line 3, delete "oi" and substitute therefor -- of --;

Claim 10, column 9, line 37, delete ";" and substitute therefor -- : --;

UNITED STATES PATENT AND TRADEMARK OFFICE
CERTIFICATE OF CORRECTION

PATENT NO. : 4,939,520
DATED : July 3, 1990
INVENTOR(S) : Biglow, James W.

It is certified that error appears in the above-identified patent and that said Letters Patent is hereby corrected as shown below:

Claim 10, column 9, line 43, delete "oi" and substitute therefor -- of --;

Claim 10, column 9, line 46, delete "couPled" and substitute therefor -- coupled --;

Claim 10, column 9, line 54, delete "irom" and substitute therefor -- from --;

Claim 10, column 9, line 56, delete "oi" and substitute therefor -- of --;

Claim 16, column 10, line 44, after "the" (second occurrence) insert -- means --;

UNITED STATES PATENT AND TRADEMARK OFFICE
CERTIFICATE OF CORRECTION

PATENT NO. : 4,939,520

DATED : July 3, 1990

INVENTOR(S) : Biglow, James W.

It is certified that error appears in the above-identified patent and that said Letters Patent is hereby corrected as shown below:

Claim 16, column 10, line 45, delete "means" (first occurrence);

Claim 17, column 10, line 55, delete "amount" and substitute therefor -- amounts --;

Claim 17, column 10, line 56, delete "first said" and substitute therefor -- said first --; and Claim 17, column 10, line 56, delete "couPled" and substitute therefor -- coupled --.

Signed and Sealed this

Ninth Day of February, 1993

Attest:

STEPHEN G. KUNIN

*Attesting Officer*     Acting Commissioner of Patents and Trademarks